(12) United States Patent
Yamaki et al.

(10) Patent No.: US 8,242,512 B2
(45) Date of Patent: Aug. 14, 2012

(54) COMPOUND SEMICONDUCTOR DEVICE

(75) Inventors: Fumikazu Yamaki, Kanagawa (JP); Kazutaka Inoue, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 37 days.

(21) Appl. No.: 12/987,426

(22) Filed: Jan. 10, 2011

(65) Prior Publication Data

US 2011/0169014 A1 Jul. 14, 2011

(30) Foreign Application Priority Data

Jan. 12, 2010 (JP) ................. 2010-004417

(51) Int. Cl.
*H01L 29/15* (2006.01)
*H01L 31/0312* (2006.01)

(52) U.S. Cl. .................. 257/77; 257/E29.104

(58) Field of Classification Search ............ 257/77, 257/E29.104
See application file for complete search history.

(56) References Cited

U.S. PATENT DOCUMENTS

| | | | | |
|---|---|---|---|---|
| 7,019,336 B2 * | 3/2006 | Yamashita et al. | ............ | 257/104 |
| 7,700,973 B2 * | 4/2010 | Shen et al. | ............ | 257/194 |
| 7,745,848 B1 * | 6/2010 | Rajagopal et al. | ............ | 257/192 |
| 2005/0001234 A1 * | 1/2005 | Inoue et al. | ............ | 257/192 |
| 2005/0221628 A1 | 10/2005 | Tanaka et al. | | |
| 2009/0085063 A1 * | 4/2009 | Makiyama et al. | ............ | 257/192 |
| 2009/0146186 A1 * | 6/2009 | Kub et al. | ............ | 257/194 |
| 2010/0314663 A1 * | 12/2010 | Ito et al. | ............ | 257/192 |
| 2011/0079771 A1 * | 4/2011 | Kanamura et al. | ............ | 257/24 |
| 2011/0084284 A1 * | 4/2011 | Zhang et al. | ............ | 257/77 |

FOREIGN PATENT DOCUMENTS

JP 2005-286135 A 10/2005

\* cited by examiner

*Primary Examiner* — Kiesha Bryant
*Assistant Examiner* — Igwe U Anya
(74) *Attorney, Agent, or Firm* — Westerman, Hattori, Daniels & Adrian, LLP

(57) ABSTRACT

A compound semiconductor device includes: an electron transit layer made of GaN; a channel layer made of AlGaN; a source electrode, a gate electrode and a drain electrode that are provided on the channel layer; a cap layer that is provided at least between the source electrode and the gate electrode and between the gate electrode and the drain electrode and is made of GaN; a recess portion that is provided in the cap layer between the gate electrode and the drain electrode; and a thick portion that is provided in the cap layer between the recess portion and the drain electrode and has a thickness larger than the recess portion.

18 Claims, 9 Drawing Sheets

COMPOUND SEMICONDUCTOR DEVICE

CROSS-REFERENCE TO RELATED APPLICATION

This application is based upon and claims the benefit of priority of the prior Japanese Patent Application No. 2010-004417, filed on Jan. 12, 2010, the entire contents of which are incorporated herein by reference.

BACKGROUND (i) Technical Field

The present invention relates to a compound semiconductor device.

(ii) Related Art

There is a demand for higher voltage and higher electrical power density of a semiconductor device. A wide band-gap semiconductor such as a nitride semiconductor is expected as a material meeting the demand. In particular, a nitride semiconductor such as GaN is expected, because GaN has wide band-gap, high thermal conductivity, hetero junction characteristics and so on. A HEMT structure having a channel layer made of AlGaN on an electron transit layer made of GaN is known as a transistor using a nitride semiconductor such as GaN.

However, there is a problem that current collapse should be restrained in the transistor having the nitride semiconductor. The current collapse is a phenomenon that current output is reduced because of large output operation at high frequency. And so, Japanese Patent Application Publication No. 2005-286135 discloses a case where a GaN thin layer (hereinafter referred to as a GaN cap layer) is provided on a channel layer made of AlGaN for a purpose of restraining the current collapse.

However, the current collapse should be restrained more in order to make a device of higher frequency and higher outputting. And so, the present inventors have researched a position of a field plate electrode between a gate electrode and a drain electrode in a transistor. However, parasitic capacity may occur with respect to the drain electrode because the field plate electrode is at a source potential (ground potential). The parasitic capacity is inescapable in high-frequency operation.

SUMMARY

It is an object of the present invention to provide a compound semiconductor device reducing the current collapse effectively without a field plate electrode.

According to an aspect of the present invention, there is provided a compound semiconductor device including: an electron transit layer made of GaN; a channel layer made of AlGaN; a source electrode, a gate electrode and a drain electrode that are provided on the channel layer; a cap layer that is provided at least between the source electrode and the gate electrode and between the gate electrode and the drain electrode and is made of GaN; a recess portion that is provided in the cap layer between the gate electrode and the drain electrode; and a thick portion that is provided in the cap layer between the recess portion and the drain electrode and has a thickness larger than the recess portion.

The gate electrode may be buried in the recess portion. The gate electrode may be in contact with the channel layer. The thick portion may have a region of which thickness increases in stages from the recess portion. The recess portion may be provided between the gate electrode and the drain electrode and between the gate electrode and the source electrode. A thick portion may be provided between one of the recess portions and the source electrode and have a thickness larger than the recess portion, the recess portion being between the gate electrode and the source electrode. A maximum thickness of the cap layer may be 10 nm or more. The thickness of the recess portion may be 2 nm to 6 nm. A distance between an end of the gate electrode and an end of the recess portion on the side of the drain electrode may be 0.2 μm to 1 μm. A composition ratio of Al of the AlGaN structuring the channel layer may be 20% to 40%.

The channel layer may be provided on a substrate comprised of SiC. The compound semiconductor device may further including a buffer layer, which is provided between the substrate and the channel layer. The buffer layer may be comprised of a laminated structure of AlN and AlGaN. Each of the source electrode, the gate electrode and the drain electrode may be formed in contact with the channel layer. The compound semiconductor device may further include a passivation film, which is formed on a surface of the cap layer. The passivation film may be comprised of SiN. A thickness of a portion in the cap layer from the recess portion to the source electrode may be constant. The thick portion may have a plurality of steps, the thicknesses of the steps are increasing toward the drain electrode from the gate electrode.

DETAILED DESCRIPTION

A description will be given of a best mode for carrying the present invention.

First Embodiment

Figure 1:
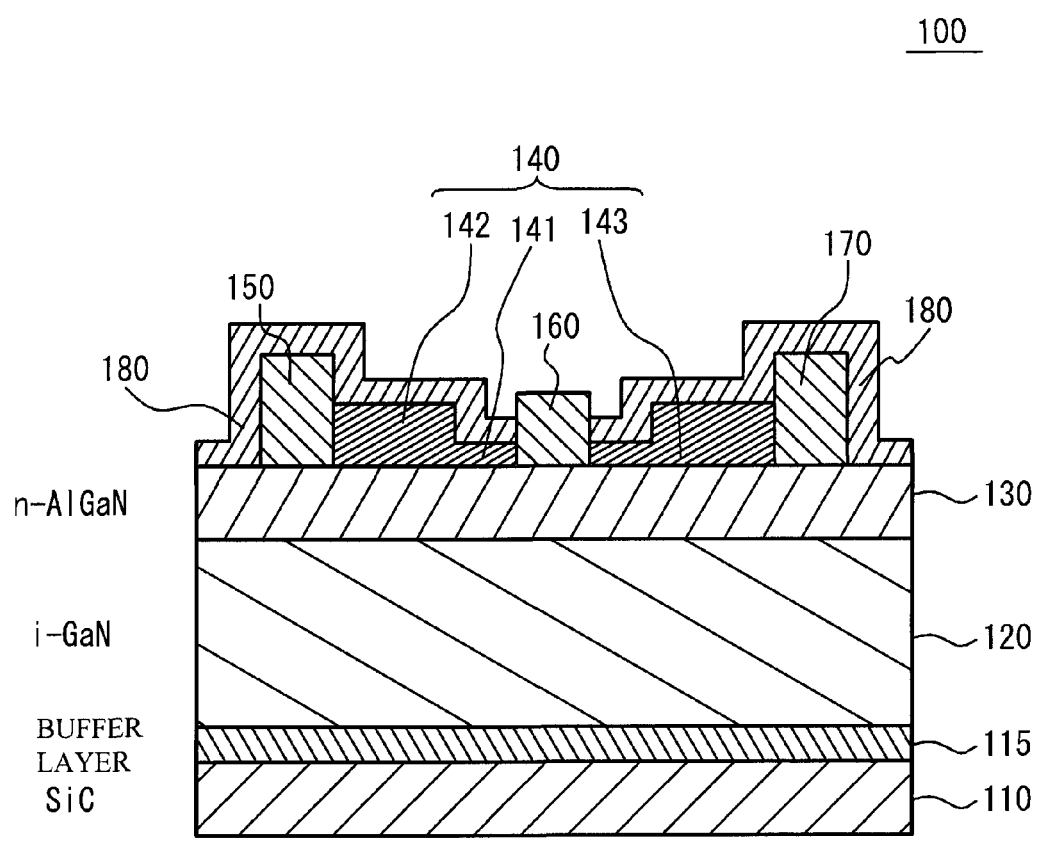
FIG. 1 illustrates a schematic cross sectional view of a compound semiconductor device in accordance with a firth embodiment.

FIG. 1 illustrates a schematic cross sectional view of a compound semiconductor device 100 in accordance with a first embodiment. As illustrated in FIG. 1, the compound semiconductor device 100 has a structure in which a buffer layer 115, an electron transit layer 120, an channel layer 130, a cap layer 140, a source electrode 150, a gate electrode 160, a drain electrode 170, and a passivation film 180 are formed on a substrate 110 in this order.

The substrate 110 is, for example, made of SiC. The buffer layer 115 has a lamination structure of AlN and AlGaN. The electron transit layer 120 is made of i-GaN that is epitaxially grown on the substrate 110. The channel layer 130 is made of n-AlGaN that is epitaxially grown on the electron transit layer 120. The channel layer 130 may be made of i-AlGaN. For example, composition ratio of Al in the AlGaN structuring the channel layer 130 is 20% to 40%. The source electrode 150 and the drain electrode 170 are an ohmic electrode in which Ti and Al are laminated in this order from the substrate 110 side. The source electrode 150 and the drain electrode 170 are provided on the channel layer 130 and are separated from each other. The gate electrode 160 is, for example, a schottky electrode in which Ni and Au are laminated in this order from the substrate 110 side, and is provided between the source electrode 150 and the drain electrode 170. In the embodiment, the source electrode 150, the gate electrode 160 and the drain electrode 170 are in contact with the channel layer 130.

The cap layer 140 is made of n-GaN and is provided on the channel layer 130 between the source electrode 150 and the gate electrode 160 and between the gate electrode 160 and the drain electrode 170. Thickness of the cap layer 140 increases toward the source electrode 150 and the drain electrode 170 from the gate electrode 160 gradually or in stages.

For example, as illustrated in FIG. 1, the cap layer 140 has a recess portion 141 between the source electrode 150 and the drain electrode 170. The recess portion 141 is a relatively thin portion of the cap layer 140. The gate electrode 160 is buried in the recess portion 141. The gate electrode 160 may not be buried in the recess portion 141 and may be in contact with the surface of the recess portion 141. The other portion of the cap layer 140 other than the recess portion 141 is hereinafter referred to as a thick portion. One thick portion on the side of the source electrode 150 is referred to as a thick portion 142. The other thick portion on the side of the drain electrode 170 is referred to as a thick portion 143.

The passivation film 180 is made of SiN layer for passivation, and covers an exposed portion of the channel layer 130, a side face and an upper face of the source electrode 150 and the drain electrode 170, an exposed portion of the cap layer 140.

In accordance with the embodiment, a surface of the compound semiconductor has a given distance from the electron transit layer because the thick portions 142 and 143 are provided. Surface electrical charge causing the current collapse occurs at the surface of the compound semiconductor. When the electron transit layer is separated from the surface electrical charge, the current collapse is effectively restrained. Thus, it is not necessary to provide a field plate electrode, in the embodiment. When the field plate electrode is not provided, drain parasitic capacity is reduced and high-frequency characteristics are improved.

Figure 2A:
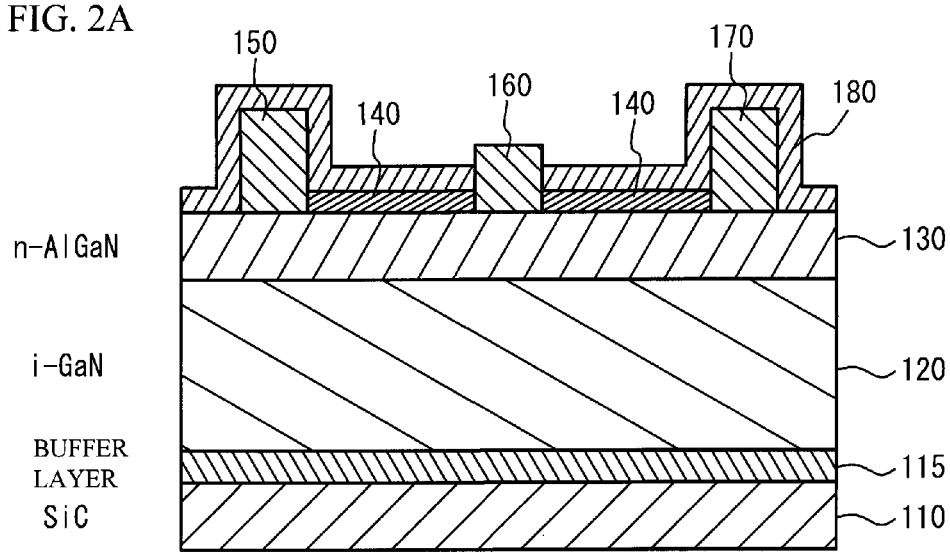
FIG. 2A and FIG. 2B illustrate a structure in which thickness of a cap layer is constant in order to simplify a research of the thickness of the cap layer.
Figure 2B:
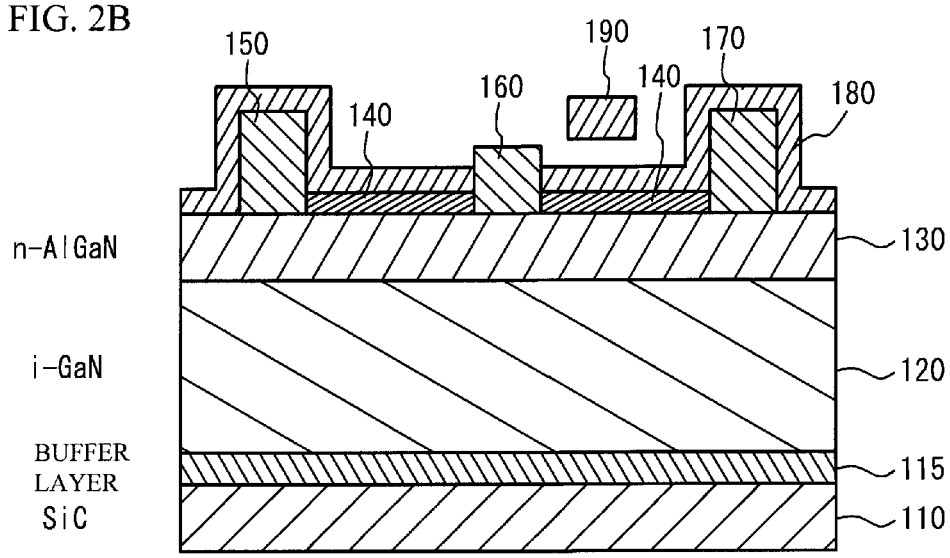

Now, a description will is given of a relationship between thickness of the cap layer and the current collapse. FIG. 2A illustrates a structure in which the thickness of the cap layer 140 is constant in order to simplify the research of the thickness of the cap layer. FIG. 2B illustrates a structure in which a field plate 190 is provided between the gate electrode and the drain electrode. The field plate 190 is grounded.

FIG. 3A through FIG. 4B illustrate a measured result of pulse IV with respect to the relationship between the thickness of the cap layer and each characteristics. In FIG. 3A through FIG. 4B, "DC 0 V" means that a base voltage applied to the drain electrode with respect to the gate electrode is zero V with the source electrode being at a ground potential. "DC 50 V" means that the base voltage applied to the drain electrode with respect to the gate electrode is 50 V with the source electrode being at the ground potential.

Figure 3A:
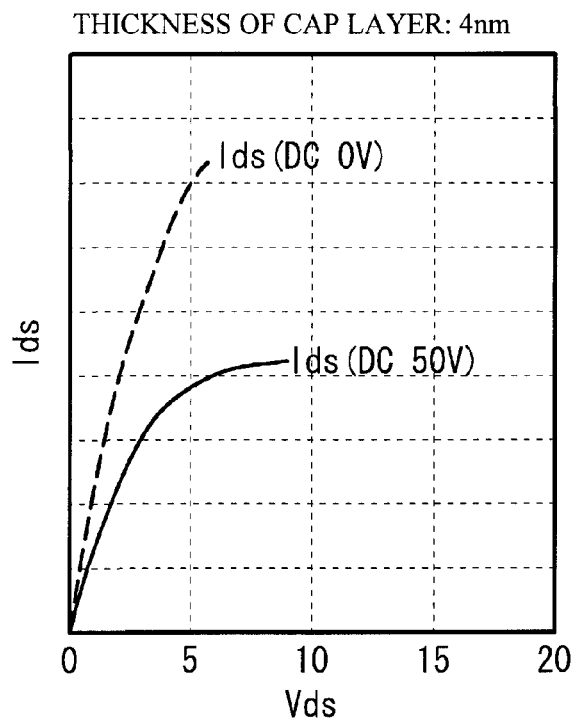
FIG. 3A and FIG. 3B illustrate an experimental result of a relationship between the thickness of the cap layer and each characteristics.
Figure 3B:
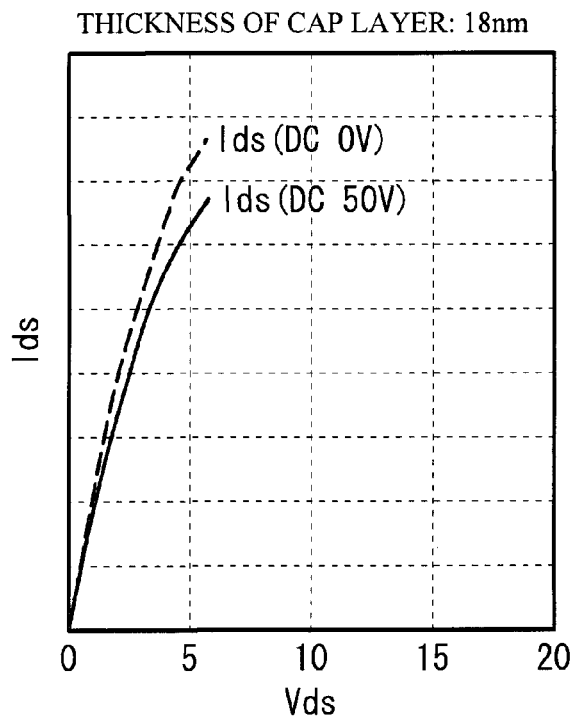

In FIG. 3A and FIG. 3B, a horizontal axis indicates a source-drain voltage "Vds", and a vertical axis indicates a source-drain current "Ids". FIG. 3A illustrates an experimental result in the structure of FIG. 2A in the case where the thickness of the cap layer is 4 nm. FIG. 3B illustrates an experimental result in the structure of FIG. 2A in the case where the thickness of the cap layer is 18 nm.

As illustrated in FIG. 3A, the source-drain current "Ids" in the case of "DC 50V" was lower than that in the case of "DC 0 V", when the thickness of the cap layer was 4 nm. Thus, it was confirmed that the current collapse occurred.

In contrast, as illustrated in FIG. 3B, the source-drain current "Ids" in the case of "DC 50V" was hardly lower than that in the case of "DC 0 V", when the thickness of the cap layer was 18 nm. Thus, it was confirmed that the current collapse was restrained when the thickness of the cap layer was increased. So, the present inventors have researched the source-drain current "Ids" in a case where the thickness of the cap layer was changed.

Figure 4A:
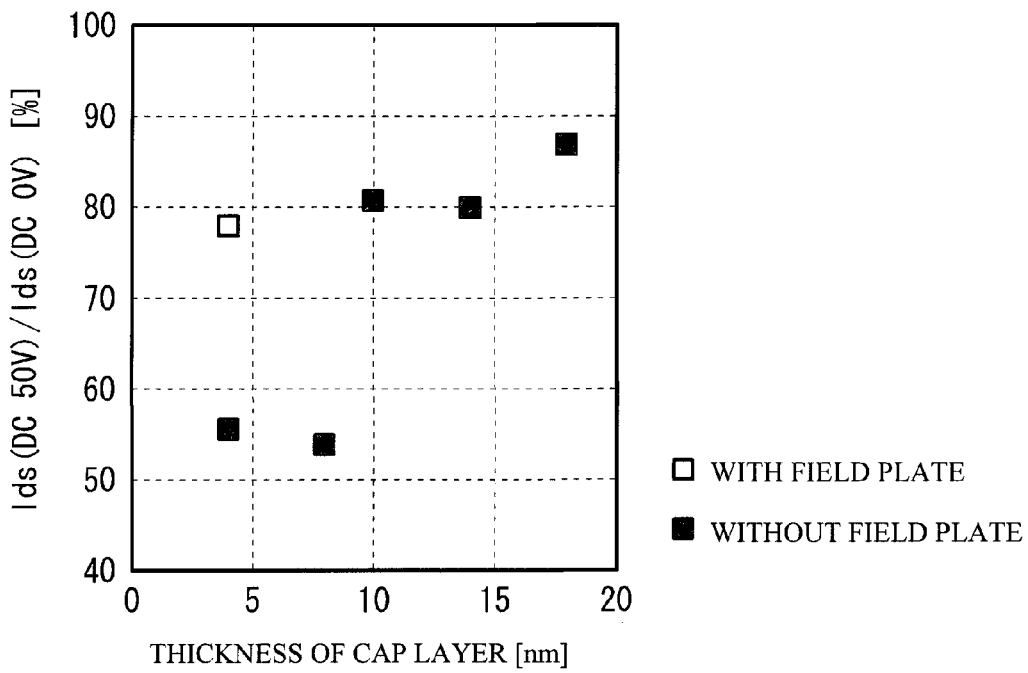
FIG. 4A and FIG. 4B illustrate the experimental result of the relationship between the thickness of the cap layer and each characteristics.

In FIG. 4A, a horizontal axis indicates the thickness of the cap layer, and a vertical axis indicates a ratio of the source-drain current "Ids" in the case of "DC 50V" with respect to that in the case of "DC 0 V". In FIG. 4A, the experimental result in the case of FIG. 2B, where the field plate electrode is provided is illustrated in addition. As illustrated in FIG. 4A, the source-drain current "Ids" in the case of "DC 50V" was kept 80% of that in the case of "DC 0 V" even if the thickness of the cap layer was 4 nm, when the field plate electrode was provided.

In the case where the field plate was not provided, the source-drain current "Ids" in the case of "DC 50V" was lower than that in the case of "DC 0 V", when the thickness of the cap layer was 8 nm or less. Thus, the current collapse occurred dynamically. However, the source-drain current "Ids" in the case of "DC 50V" was kept 80% or more of that in the case of "DC 0 V", when the thickness of the cap layer was 10 nm or more. Thus, the current collapse was restrained as well as the case where the field plate electrode was provided or more.

Figure 4B:
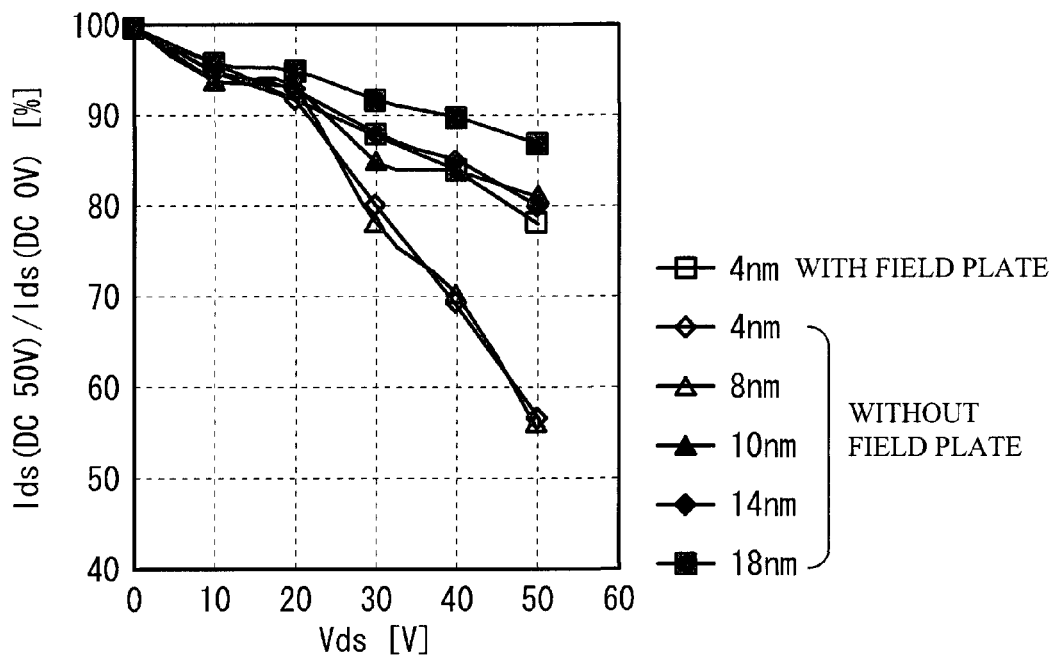

In FIG. 4B, a horizontal axis indicates the source-drain voltage "Vds", and a vertical axis indicates the ratio of the source-drain current "Ids" in the case of "DC 50V" with respect to that in the case of "DC 0 V". As illustrated in FIG. 4B, the source-drain current "Ids" in the case of "DC 50V" was kept 80% or more of that in the case of "DC 0 V" when the source-drain voltage of 50V was applied even if the thickness of the cap layer was 4 nm, when the field plate electrode was provided.

In the case where the field plate electrode was not provided, reduction width of the source-drain current "Ids" in the case of "DC 50V" with respect to that in the case of "DC 0 V" was increased as the source-drain voltage increased, when the thickness of the cap layer was 8 nm or less. However, the source-drain current "Ids" in the case of "DC 50V" with respect to that in the case of "DC 0 V" was kept 80% or more when the source-drain voltage of 50V was applied, even if the thickness of the cap layer was 10 nm or more.

It is therefore confirmed that the current collapse is restrained when the thickness of the cap layer is increased, for example 10 nm or more, even if the field plate electrode is not provided.

However, the enlargement of the thickness of the cap layer may cause mitigation of piezo electrical field of the channel layer 130 with respect to the electron transit layer 120. The mitigation of the piezo electrical field may cause reduction of density of two-dimensional electron gas in the electron transit layer 120.

The composition ratio of Al in the AlGaN structuring the channel layer 130 may be increased or the thickness of the channel layer 130 may be increased, in order to restrain the mitigation of the piezo electrical field in the case of the enlargement of the thickness of the cap layer. However, the increase of the composition ratio of Al in the AlGaN may cause degradation of surface morphology of the AlGaN crystal. Desirable device characteristics may not be obtained because of the degradation of the surface morphology when the composition ratio of Al is increased to 35% or more, further to 40% or more, although the desirable device characteristics depends on a crystal growth method.

The enlargement of the thickness of the channel layer 130 may cause a problem that the distance between the gate electrode 160 and the electron transit layer 120 may be enlarged, pinch-off characteristics may be degraded, and a desirable gain may not be obtained.

In the embodiment, the recess portion 141 is provided in order to solve the problem caused by the enlargement of the thickness of the whole cap layer. The thick portions 142 and 143 have large thickness in order to restrain the current collapse. The recess portion 141 has the thickness that is smaller than that of the thick portions 142 and 143. Thus, the mitigation of the piezo electrical field is restrained, and the demand for enlarging the composition ratio of Al or the thickness of the electron transit layer 130 is not needed or is reduced. It is preferable that the thickness of the thick portions 142 and 143 of the cap layer is 10 nm or more.

On the other hand, the recess portion 141 has only to have a minimum thickness for protecting the channel layer 130. Therefore, the recess portion 141 has the thickness of 6 nm or less, and has only to have the thickness of at least approximately 2 nm corresponding to three unit cells.

If the width of the recess portion 141 on the side of the drain electrode 170 is enlarged, the effect of the current collapse restraint may be reduced. It is therefore preferable that the distance between the end of the gate electrode 160 and the end of the thick portion 143 (the width of the recess portion 141 on the side of the drain electrode 170) is 1 μm or less. On the other hand, it is preferable that the distance is 0.2 μm or more, considering the restraint effect of the piezo electrical field.

Figure 5A:
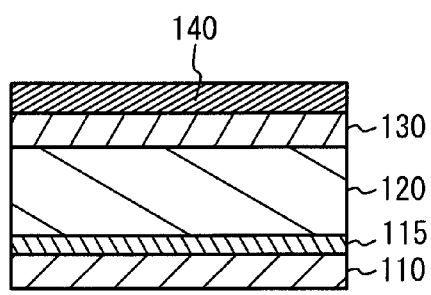
FIG. 5A through FIG. 5F illustrate a flow of a manufacturing method of the compound semiconductor device.

FIG. 5A through FIG. 5F illustrate a flow of an example of a manufacturing method of the compound semiconductor device 100. As illustrated in FIG. 5A, a lamination structure is prepared. The lamination structure has a structure in which the buffer layer 115, the electron transit layer 120, the channel layer 130 and the cap layer 140 are laminated on the substrate 110. The lamination structure may be manufactured when the buffer layer 115, the electron transit layer 120, the channel layer 130 and the cap layer 140 are epitaxially grown on the substrate 110.

Figure 5D:
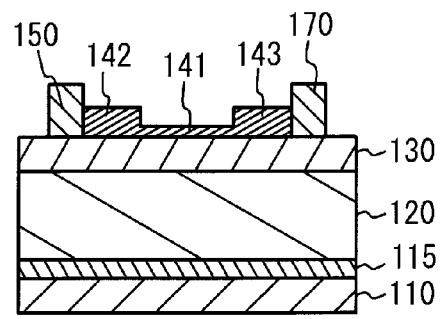
Figure 5B:
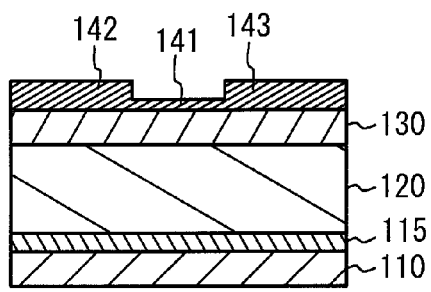

Next, as illustrated in FIG. 5B, the cap layer 140 is subjected to a dry etching process of chlorine-based gas with use of a RIE etching equipment, and thus a concave portion is formed in the cap payer 140. An ICP etching device may be used instead of the RIE etching equipment. Thus, the recess portion 141 and the thick portions 142 and 143 are formed in the cap layer 140.

Figure 5E:
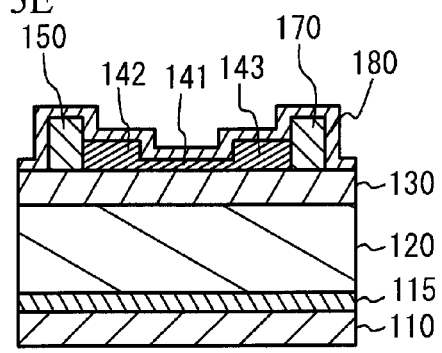
Figure 5C:
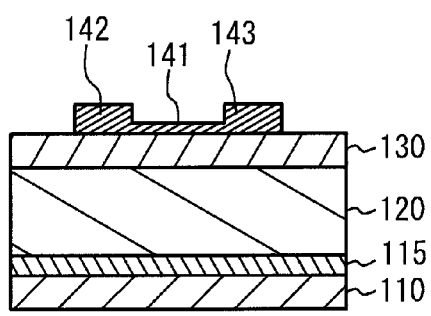

Next, as illustrated in FIG. 5C, areas of the cap layer 140 where the source electrode and the drain electrode are to be formed are subjected to a dry etching process of chlorine-based gas with use of the RIE etching equipment. Thus, parts of the channel layer 130 are exposed.

Next, as illustrated in FIG. 5D, the source electrode 150 is formed on one of the exposed parts on the upper face of the channel layer 130. And, the drain electrode 170 is formed on the other of the exposed parts on the upper face of the channel layer 130. Then, as illustrated in FIG. 5E, the passivation film 180 is formed so as to cover the exposed areas of the cap layer 140, the source electrode 150, the drain electrode 170, and the channel layer 130.

Figure 5F:
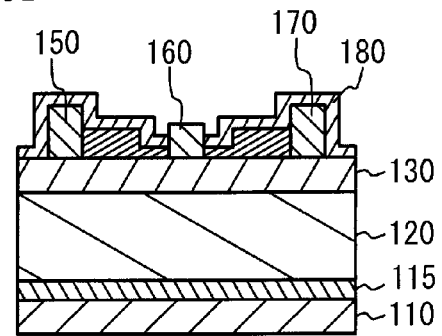

Next, as illustrated in FIG. 5F, the passivation film 180 at the recess portion 141 is subjected to a dry etching process of fluorine-based gas with use of the RIE etching equipment.

In the dry etching process of FIG. 5F, the etching process is continued by the time when the channel layer 130 is exposed. In this case, the recess portion 141 is subjected to a dry etching process of chlorine-based gas with use of the RIE etching equipment. Thus, a hole is formed in the recess portion 141. Next, the gate electrode 160 is formed in the hole. At last, the upper faces of the source electrode 150 and the drain electrode 170 are exposed. With the processes, the compound semiconductor device 100 is manufactured.

Second Embodiment

Figure 6:
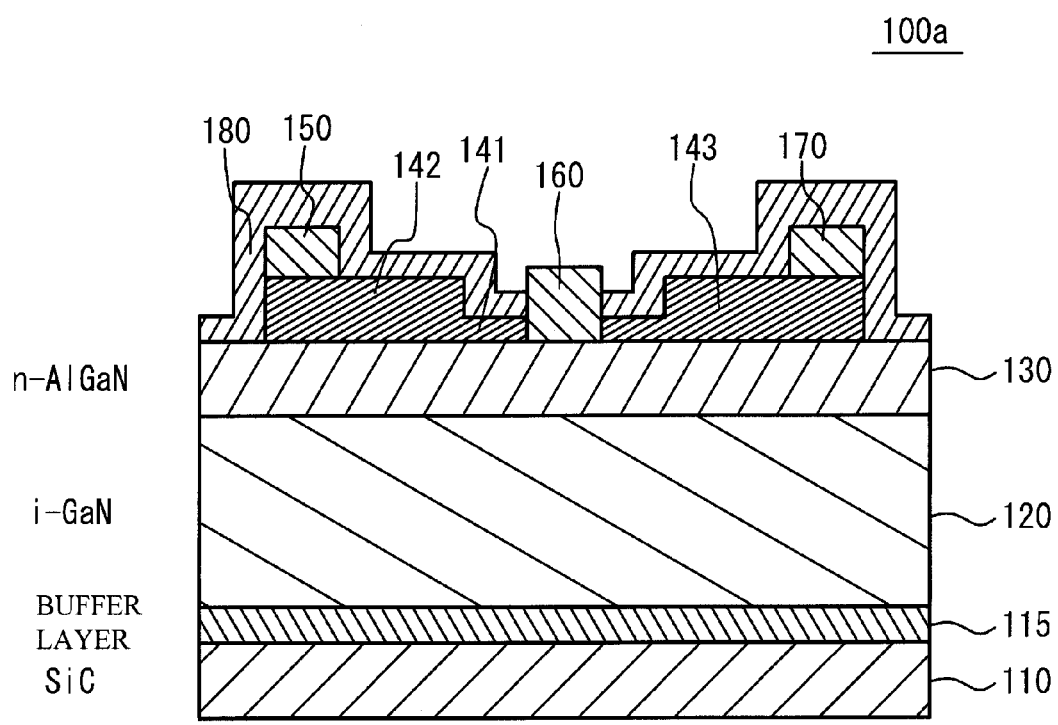
FIG. 6 illustrates a schematic cross sectional view of a compound semiconductor device in accordance with a second embodiment.

FIG. 6 illustrates a schematic cross sectional view of a compound semiconductor device 100a in accordance with a second embodiment. As illustrated in FIG. 6, the compound semiconductor device 100a is different from the compound semiconductor device 100 of FIG. 1 in points that the thick portion 142 extends to between the source electrode 150 and the channel layer 130, and the thick portion 143 extends to between the drain electrode 170 and the channel layer 130. In this embodiment, the thickness of the cap layer 140 increases toward the source electrode 150 from the gate electrode 160 and toward the drain electrode 170 from the gate electrode 160. Therefore, the current collapse may be restrained, and the desirable current characteristics may be obtained.

Third Embodiment

Figure 7:
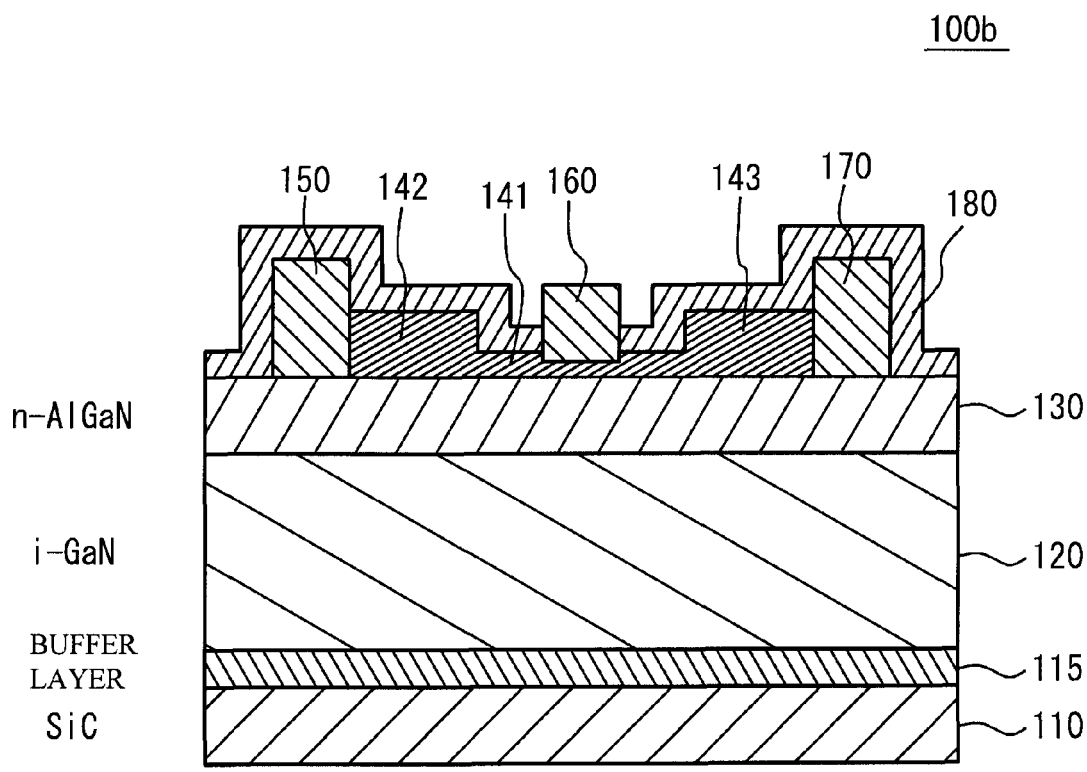
FIG. 7 illustrates a schematic cross sectional view of a compound semiconductor device in accordance with a third embodiment.

FIG. 7 illustrates a schematic cross sectional view of a compound semiconductor device 100b in accordance with a third embodiment. As illustrated in FIG. 7, the compound semiconductor device 100b is different from the compound semiconductor device 100 in a point that the gate electrode 160 is in contact with the cap layer 140. An area of the cap layer 140 where the gate electrode 160 is to be formed has the thickness that is smaller than the recess portion 141. In this embodiment, the thickness of the cap layer 140 increases toward the source electrode 150 from the gate electrode 160 and toward the drain electrode 170 from the gate electrode 160. Therefore, the current collapse may be restrained, and the desirable current characteristics may be obtained.

Fourth Embodiment

Figure 8:
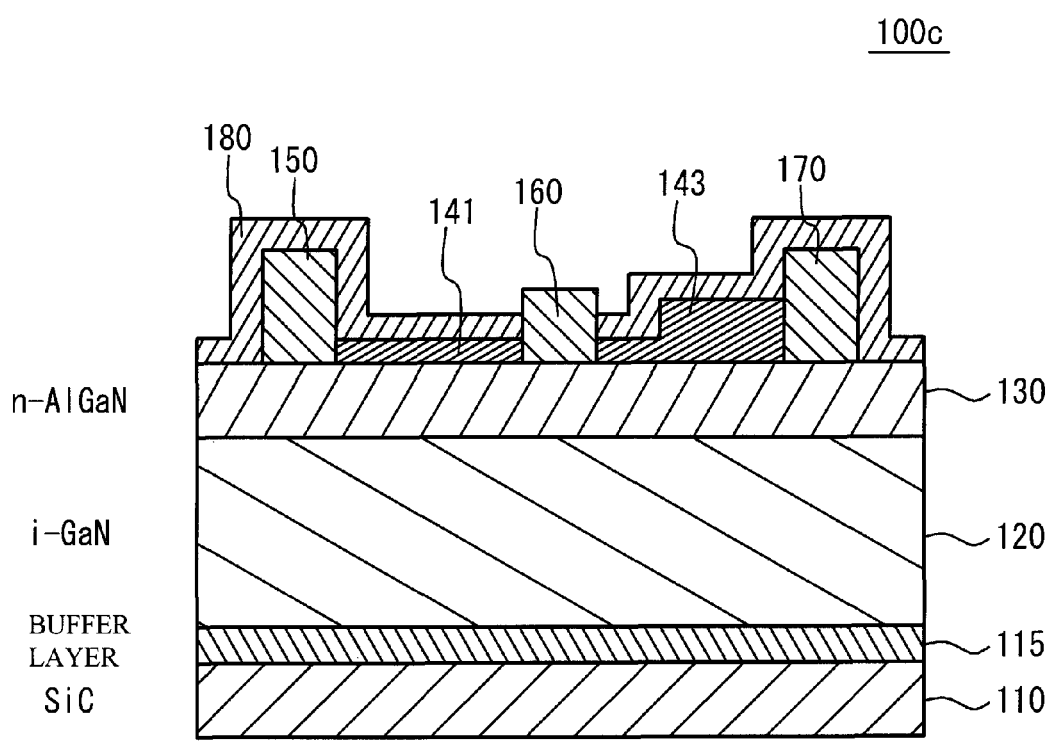
FIG. 8 illustrates a schematic cross sectional view of a compound semiconductor device in accordance with a fourth embodiment.

FIG. 8 illustrates a schematic cross sectional view of a compound semiconductor device 100c in accordance with a fourth embodiment. As illustrated in FIG. 8, the compound semiconductor device 100c is different from the compound semiconductor device 100 of FIG. 1 in a point that the cap layer 140 fails to have the thick portion 142. That is, in the embodiment, the cap layer 140 has a constant thickness from the gate electrode 160 to the source electrode 150. And, the thickness of the cap layer 140 increases toward the drain electrode 170 from the gate electrode 160. Electrical field applied between the gate electrode and the drain electrode is higher than that applied between the gate electrode and the source electrode. Thus, the number of the carriers trapped toward the passivation film 180 between the gate electrode and the drain electrode is extremely larger than that between the gate electrode and the source electrode. Therefore, the trapped carriers between the gate electrode and the drain electrode mainly control the current collapse. Accordingly, the current collapse is restrained without the thick portion between the gate electrode and the source electrode.

Fifth Embodiment

Figure 9:
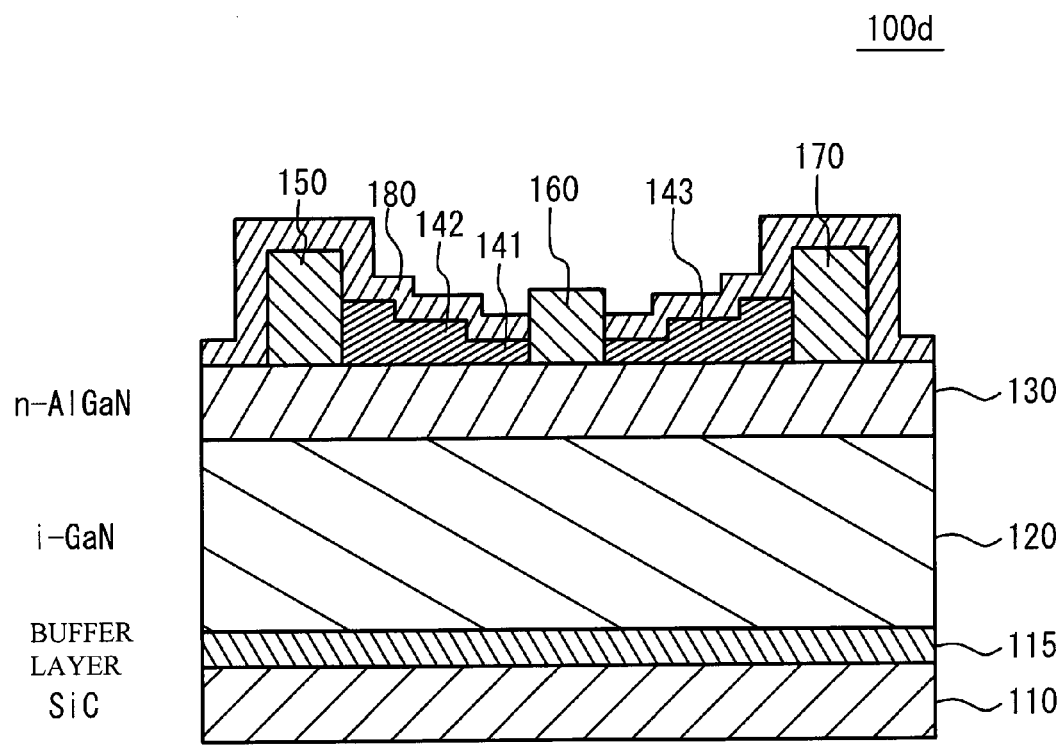
FIG. 9 illustrates a schematic cross sectional view of a compound semiconductor device in accordance with a fifth embodiment.

FIG. 9 illustrates a schematic cross sectional view of a compound semiconductor device 100*d* in accordance with a fifth embodiment. As illustrated in FIG. 9, the compound semiconductor device 100*d* is different from the compound semiconductor device 100 of FIG. 1 in points that the thickness of the thick portion 142 increases in stages toward the source electrode 150 from the gate electrode 160, and the thickness of the thick portion 143 increases in stages toward the drain electrode 170 from the gate electrode 160. In the embodiment, the thick portions 142 and 143 have a plurality of stages of thickness. Thus, the thick portions 142 and 143 reduce the current collapse. And, the electrical field is scattered. Accordingly, the tolerance is improved.

The present invention is not limited to the specifically disclosed embodiments and variations but may include other embodiments and variations without departing from the scope of the present invention.

What is claimed is:

1. A compound semiconductor device comprising:
    an electron transit layer made of GaN;
    a channel layer made of AlGaN;
    a source electrode, a gate electrode and a drain electrode that are provided on the channel layer;
    a cap layer that is provided at least between the source electrode and the gate electrode and between the gate electrode and the drain electrode and is made of GaN;
    a recess portion that is provided in the cap layer between the gate electrode and the drain electrode; and
    a thick portion that is provided in the cap layer between the recess portion and the drain electrode and has a thickness larger than the recess portion.

2. The compound semiconductor device as claimed in claim 1, wherein the gate electrode is buried in the recess portion.

3. The compound semiconductor device as claimed in claim 1, wherein the gate electrode is in contact with the channel layer.

4. The compound semiconductor device as claimed in claim 1, wherein the thick portion has a region of which thickness increases in stages from the recess portion.

5. The compound semiconductor device as claimed in claim 1, wherein the recess portion is provided between the gate electrode and the drain electrode and between the gate electrode and the source electrode.

6. The compound semiconductor device as claimed in claim 5, wherein a thick portion is provided between one of the recess portions and the source electrode and has a thickness larger than the recess portion, the recess portion being between the gate electrode and the source electrode.

7. The compound semiconductor device as claimed in claim 1, wherein a maximum thickness of the cap layer is 10 nm or more.

8. The compound semiconductor device as claimed in claim 1, wherein the thickness of the recess portion is 2 nm to 6 nm.

9. The compound semiconductor device as claimed in claim 1, wherein a distance between an end of the gate electrode and an end of the recess portion on the side of the drain electrode is 0.2 μm to 1 μm.

10. The compound semiconductor device as claimed in claim 1, wherein a composition ratio of Al of the AlGaN structuring the channel layer is 20% to 40%.

11. The compound semiconductor device as claimed in claim 1, wherein the channel layer is provided on a substrate comprised of SiC.

12. The compound semiconductor device as claimed in claim 11, further comprising a buffer layer, which is provided between the substrate and the channel layer.

13. The compound semiconductor device as claimed in claim 12, wherein the buffer layer is comprised of a laminated structure of AlN and AlGaN.

14. The compound semiconductor device as claimed in claim 1, wherein each of the source electrode, the gate electrode and the drain electrode is formed in contact with the channel layer.

15. The compound semiconductor device as claimed in claim 1, further comprising a passivation film, which is formed on a surface of the cap layer.

16. The compound semiconductor device as claimed in claim 15, wherein the passivation film is comprised of SiN.

17. The compound semiconductor device as claimed in claim 1, wherein a thickness of a portion in the cap layer from the recess portion to the source electrode is constant.

18. The compound semiconductor device as claimed in claim 1, wherein the thick portion has a plurality of steps, the thicknesses of the steps are increasing toward the drain electrode from the gate electrode.

* * * * *